United States Patent [19]

Cernigliaro et al.

[11] 4,439,516
[45] Mar. 27, 1984

[54] HIGH TEMPERATURE POSITIVE DIAZO PHOTORESIST PROCESSING USING POLYVINYL PHENOL

[75] Inventors: George J. Cernigliaro, Framingham; Charles R. Shipley, Newton, both of Mass.

[73] Assignee: Shipley Company Inc., Newton, Mass.

[21] Appl. No.: 357,971

[22] Filed: Mar. 15, 1982

[51] Int. Cl.$^3$ .................. G03F 7/08; G03C 5/00; B05D 3/02

[52] U.S. Cl. .................. 430/323; 430/192; 430/193; 430/166; 430/309; 430/310; 430/311; 430/315; 430/318; 430/330; 430/326

[58] Field of Search .............. 430/330, 326, 325, 309, 430/310, 302, 5, 323, 311, 315, 318

[56] References Cited

U.S. PATENT DOCUMENTS

| | | | |
|---|---|---|---|
| 3,869,292 | 3/1975 | Peters | 430/302 |
| 4,015,986 | 4/1977 | Paal et al. | 430/330 |
| 4,093,461 | 6/1978 | Loprest et al. | 430/330 |
| 4,125,650 | 11/1978 | Chiu et al. | 430/5 |
| 4,259,430 | 3/1981 | Kaplan et al. | 430/330 |
| 4,268,602 | 5/1981 | Yoshino et al. | 430/330 |
| 4,339,521 | 7/1982 | Ahne et al. | 430/270 |

FOREIGN PATENT DOCUMENTS

1154749 6/1969 United Kingdom .............. 430/330

OTHER PUBLICATIONS

Anon, "Microposit TM MF 314 Developer", Shipley Co., Inc. 4 pp., 2/1982.
Bickford et al., *IBM Tech. Discl. Bulletin*, vol. 16, No. 1, p. 47, 6/1973.
De Forest, "Photoresist Material and Processes", pp. 244-246, McGraw Hill Book Co., 1975.

*Primary Examiner*—Charles L. Bowers, Jr.

[57] ABSTRACT

This invention is for a photoresist capable of withstanding temperatures in excess of 200° C. without image distortion. The photoresist comprises a high temperature diazo sensitizer, preferably an ester or amide of an o-quinone diazide sulfonic or carboxylic acid chloride, in a binder comprising a polyvinyl phenol. The sensitizer and polyvinyl phenol react with each other at elevated temperature. The sensitizer has a secondary decomposition temperature and the polyvinyl phenol has a flow temperature at least equal to the temperature where reaction between the two occurs.

17 Claims, 1 Drawing Figure

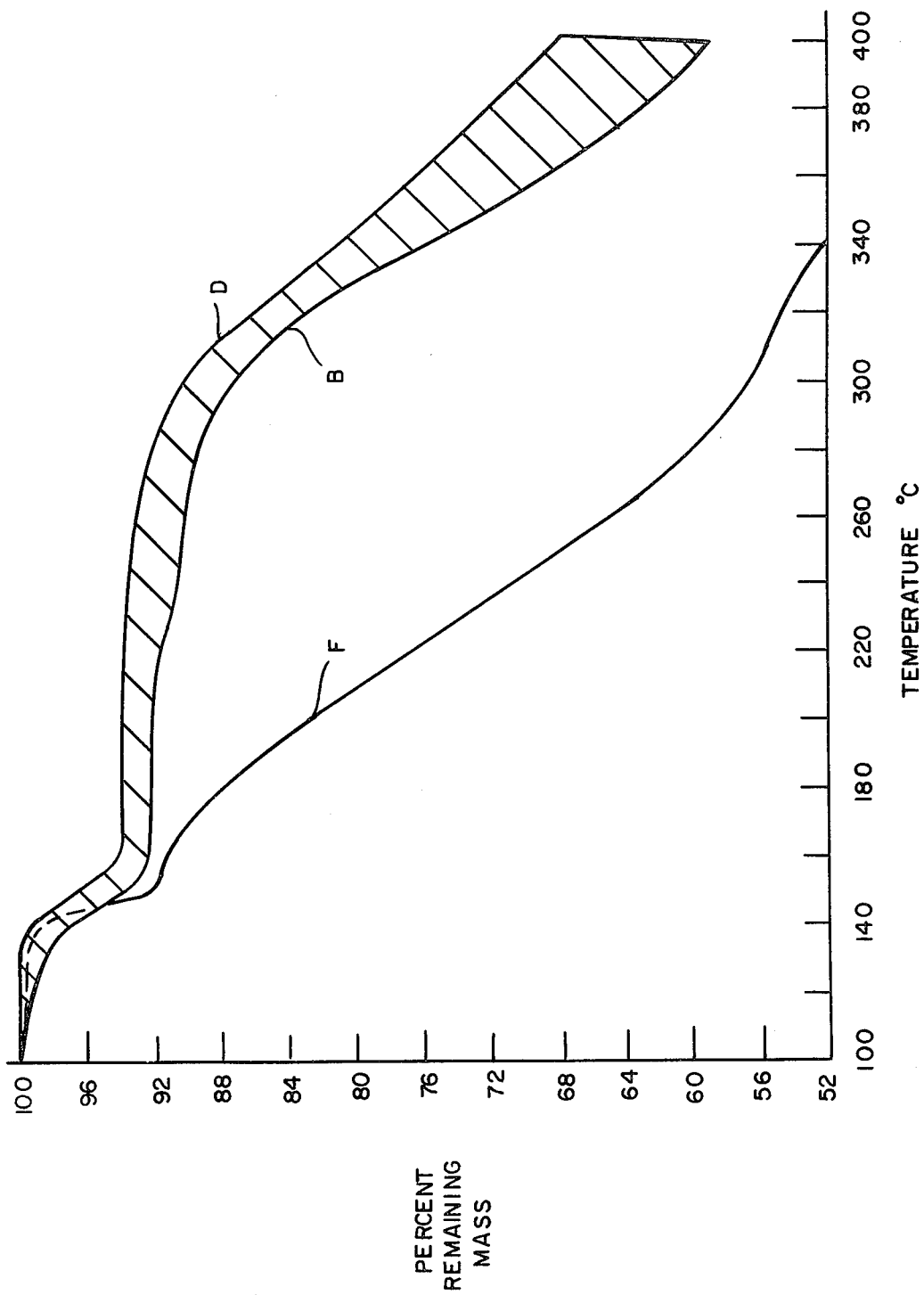

HIGH TEMPERATURE POSITIVE DIAZO PHOTORESIST PROCESSING USING POLYVINYL PHENOL

BACKGROUND OF THE INVENTION

1. Introduction

This invention relates to positive working photoresists that are especially useful for high temperature applications, and more particularly, to photoresist compositions comprising a positive working light sensitive compound in an alkali soluble binder comprising a homopolymer or copolymer of a vinyl phenol, to a method for obtaining high temperature resistance and to articles formed therefrom.

2. Description of the Prior Art

Photoresist compositions are well known in the art and are described in numerous publications including DeForest, *Photoresist Materials and Processes,* McGraw-Hill Book Company, New York, 1975. Photoresists comprise coatings produced from solution or applied as a dry film which, when exposed to light of the proper wave length, are chemically altered in their solubility to certain solvents (developers). Two types are known. The negative acting resist is initially a mixture which is soluble in its developer but, following exposure to activating radiation, becomes insoluble in developer thereby defining a latent image. Positive-acting resists work in the opposite fashion, light exposure making the resist soluble in developer.

Positive working photoresists are more expensive than negative working photoresists but are capable of providing superior image resolution. For example, the positive working photoresists described above can be developed to yield relief images with a line width as low as 1 micron or less. In addition, considering the cross-section of a photoresist image, the channels formed in the resist by development have square corners and side walls with only minimal taper.

The positive-working photoresists comprise a light sensitive compound in a film-forming polymeric binder. The light sensitive compounds or sensitizers, as they are often called, most frequently used are esters and amides formed from o-quinone diazide sulfonic and carboxylic acids. These esters and amides are well known in the art and described by DeForest, supra, pages 47 through 55, incorporated herein by reference. These light sensitive compounds, and the methods used to make the same, are all well documented in prior patents including German Patent No. 865,140 granted Feb. 2, 1953 and U.S. Pat. Nos. 2,767,092; 3,046,110; 3,046,112; 3,046,119; 3,046,121; 3,046,122 and 3,106,465, all incorporated herein by reference. Additional sulfonamide sensitizers that have been used in the formulation of positive-working photo-resists are shown in U.S. Pat. No. 3,637,384, also incorporated hereby by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213 incorporated herein by reference. Other positive working diazo compounds have been used for specific purposes. For example, a diazo compound used as a positive working photoresist for deep U.V. lithography in Meldrum's diazo and its analogs as described by Clecak et al, Technical Disclosure Bulletin, Vol. 24, No. 4, September 1981, IBM Corp., pp 1907 and 1908. An o-quinone diazide compound suitable for laser imaging is shown in U.S. Pat. No. 4,207,107. The aforesaid references are also incorporated herein by reference.

The resin binders most frequently used with the o-quinone diazides in commercial practice are the alkali soluble phenol formaldehyde resins known as the Novolak resins. Photoresists using such polymers are illustrated in U.K. Pat. No. 1,110,017, incorporated herein by reference. These materials are the product of a reaction of a phenol and formaldehyde under conditions whereby a thermoplastic polymer is formed with a melting point of about 125° C. Novolaks with melting points well in excess of 125° C. are known but are not generally used in photoresist formulations because they are often brittle or have other properties limiting their use.

Another class of binders used with the o-quinone diazides are the homopolymers and copolymers of vinyl phenol. Photoresists of this nature are disclosed in U.S. Pat. No. 3,869,292 incorporated herein by reference. It is believed that photoresists using binders of polymers formed from vinyl phenols have not been used in commerce.

In the prior art, the above described positive resists using Novolak resins as a binder are most often used as masks to protect substrates from chemical etchants in photoengraving processes. For example, in a conventional process for the manufacture of a printed circuit board, a copper clad substrate is coated with a layer of a positive working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine line resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by development of the photoresist are dissolved while the portions of the wafer coated with photoresist are protected, thereby defining a circuit pattern. For use in the manufacture of a semiconductor, the photoresist must possess resistance to the chemical etchant, must adhere to the surface of the semiconductor wafer and must be capable of very fine line image resolution.

A more recent development in the fabrication of semiconductors substitutes dry plasma etching for wet chemical etching to define a circuit. Plasma etching is the etching of a material by reaction with chemically active gaseous radicals formed by glow discharge. It provides advantages over wet chemical etching in that it offers process simplification and improved dimensional resolution and tolerance. Procedures for plasma etching are known and described in the literature, for example, Paulsen, Plasma Etching in Integrated Circuit Manufacture, *J. Vac. Sci. Technical,* Vol. 14, No. 1, Jan./Feb. 1977, pp 266 to 274.

Whether a semiconductor is manufactured using wet chemical etchants or plasma etching, photoresists are required to define an image pattern and to protect the surface of the wafer where etching is not desired. However, the demands on the resist are significantly greater when using plasma etching. For both wet etching and plasma etching, the resist must adhere to the substrate and must be capable of fine line image resolution. For plasma etching, in addition to these properties, the resist must often be capable of withstanding high temperatures without image deformation and without eroding as plasma etching generates high temperatures at the wafer surface.

The prior art positive working resists described above provide good resistance to chemical etchants and fine line image resolution. However, they soften and begin to flow at temperatures in excess of about 120° C. In addition, these resists tend to erode when struck by the gas stream generated during plasma etching. This results in a rounding of the desired square corners of the resist image, a flow and filling in of the channels formed by development of the resist and a thinning of the resist layer, all of which result in image distortion and poorer image resolution.

SUMMARY OF THE INVENTION

The subject invention is directed to positive working photoresists that are useful for the same purposes as prior art resists. In addition, because of a capability to withstand elevated temperature without image distortion, the resists are also useful in processes involving exposure to elevated temperatures such as reactive ion etching, plasma etching, and ion implantation.

The photoresists comprise a sensitizer that is an ester or amide of an o-quinone diazide sulfonic or carboxylic acid in a binder dominated by polyvinyl phenol, but which may also contain other optical additives. The invention is predicated upon the discovery that at an elevated temperature, reaction occurs between the sensitizer and the polyvinyl phenol component of the binder which substantially increases the temperature that the resist is able to withstand without image distortion. By selection of a sensitizer having a secondary decomposition temperature and a polyvinyl phenol having a flow temperature approximately equal to or greater than the temperature at which reaction between the two occurs, the photoresist will be able to withstand processing temperatures of 200° C. or greater without image distortion.

The photoresists of this invention are used by coating the same onto a substrate, exposing the resist coating to activating radiation and developing the resist to form the desired image. Regardless of the heat generated during the processing sequence, image distortion will not occur. If the resist is to be used in a processing sequence where a temperature in excess of about 150° C. is generated, the heating of the resist as an incident to the processing sequence will cause reaction between the unexposed sensitizer and polyvinyl phenol with subsequent substantial increase in the temperature at which the resist image will distort. Consequently, image distortion will not occur at temperatures in excess of about 150° C. to 160° C. because of this reaction. Image distortion will not occur at temperatures below about 150° C. to 160° C. because high temperature materials able to withstand such temperatures without flow were selected in the formulation of the resist.

It is surprising and unexpected that elevating the temperature of the imaged photoresist layer as described results in a final photoresist image able to withstand temperatures in excess of the flow resistance temperature of the photoresist mass. For example, by way of comparison, little or no improvement is realized by a conventional post bake of a photoresist comprising a sensitizer in those Novolak resin binders conventionally used in the formulation of photoresists as described in the prior art.

The properties of the photoresists of the invention render the photoresist useful for purposes for which many prior art resists are unsuitable. For example, the photoresists of the invention are especially useful for plasma etching, especially high temperature reactive ion etching, as the results are capable of withstanding high temperatures without image distortion and are not excessively eroded by plasma streams not containing gaseous strippers for the resists. As aforesaid, prior art resists, though used for plasma etching, erode and are significantly reduced in thickness by plasma etching.

DESCRIPTION OF THE DRAWING

The drawing sets forth maximum and minimum decomposition curves generated by thermogravimetric analysis of selected high temperature sensitizers and an analysis of a low temperature sensitizer for purposes of comparison.

DESCRIPTION OF THE PREFERRED EMBODIMENTS

Various terms will repeat themselves throughout the specification. To facilitate an understanding of the invention, these terms are defined as follows:

"The secondary decomposition temperature" of the sensitizer is defined as that temperature where the sensitizer begins to lose substantial mass following its initial loss of nitrogen as shown in the drawing. Unexposed sensitizer of o-quinone diazide sulfonic and carboxylic acids generally undergoes at least two decompositions when heated to elevated temperatures. The first decomposition is believed to be loss of nitrogen which loss generally begins at a temperature above 120° C., dependent upon the sensitizer, and continues as temperature increases to about 150° C. Again, dependent upon the particular sensitizer selected, the nitrogen generally comprises between about two-and-one-half and ten percent of the total mass of the sensitizer. Following nitrogen loss, there is a second decomposition as temperature is increased further. The second decomposition can occur over a relatively wide temperature range where the balance of the compound decomposes and is destroyed. This secondary decomposition may begin immediately following the first decomposition or may begin and continue at a temperature substantially higher than the temperature at which the primary decomposition occurs. A thermogravimetric analysis of decomposition is depicted in the drawing where decomposition curves are set forth for the high temperature sensitizers of Example 1 and the low temperature sensitizer of Examples 15 and 16. The top curve is for sensitizers of Example 1 where the upper part of the curve depicts decomposition of sensitizer D and the lower portion of the curve depicts decomposition of sensitizer B. The decomposition curves for the remaining sensitizers of Example 1 fall within the shaded range. The lower curve is for the sensitizer of Examples 15 and 16. From the curves, it can be seen that the first decomposition for all the sensitizers tested began at a temperature of about 125° C. and continued to a temperature of about 150° C. resulting in a loss of mass of from about three to eight percent of the total mass of the sensitizer. Thereafter, for the sensitizers of Example 1, there was only limited loss of mass until a temperature of from about 220° C. to about 270° C. was encountered at which point significant loss of mass occurred showing rapid decomposition of the sensitizer. In comparison, for the sensitizer of Examples 15 and 16, substantial loss of mass followed the initial nitrogen loss.

A "high temperature sensitizer" is one having a secondary decomposition temperature equal to or above that temperature at which reaction occurs between the sensitizer and polyvinyl phenol used in the preparation of the resist.

The "flow temperature" of the polyvinyl phenol is defined as that temperature where movement of the polymer occurs. This temperature is not necessarily the melt point of the polymer. As is known, when a solid polymer is heated, it usually changes from a solid to a liquid over a range of temperature rather than at a single precise temperature. The temperature where melting occurs, and the viscosity of the polymer in its liquid state, is also dependent upon numerous factors such as the polymer's weight average molecular weight, the molecular weight distribution of the polymer, its degree of crosslinking, etc. In its liquid or semi-liquid state, the viscosity of the polymer may be sufficiently high so that the polymer will not move. However, as heating continues, the viscosity of the polymer will generally decrease and eventually movement of the polymer will occur. The temperature at which movement can occur is considered to be the flow temperature of the polymer for purposes of this invention.

The "photoresist distortion temperature" is defined as that temperature where image resolution is not sufficient to meet the requirements of the following test identified as the window test. The test procedure comprises coating a chrome substrate with a test resist and imaging the resist to form an image of an open rectangle in the resist coating having a thickness of about 1 micron and having two of the parallel walls of the rectangle separated by a width of 1.5 microns. For purposes of the test, the resist image in the configuration of the rectangle in the coating of the resist is then heated to a given elevated temperature and held at this temperature for thirty minutes. If, following heating and cooling, microscopic examination at 900× magnification reveals that the resist has flowed into and filled the rectangle or its shape at the interface of the resist and the chrome substrate has been distorted, the test temperature is considered to be above the distortion temperature of the resist. Alternatively, if the rectangle remains substantially open following heating and distortion at the interface is not observed, the test temperature is considered to be below the image distortion temperature of the resist. The results obtained can be confirmed by etching the chrome, removing the resist and microscopically examining the etched image for image reproduction. When performing the test, the shape of the resist walls of the rectangle may be altered without photoresist image distortion. When exposed and developed, a cross section of the resist image usually shows sharp corners. Following prolonged exposure to elevated temperatures, these sharp corners may be somewhat rounded but this change is not to be confused with distortion of the resist image as image distortion is caused by movement of the photoresist at its interface with the substrate upon which it is coated.

The photoresists of the invention comprise a high temperature, positive working diazo sensitizer in a binder dominated by a polyvinyl phenol where the polyvinyl phenol has a flow temperature approximately at or above the temperature where reaction between the sensitizer and polyvinyl phenol can occur. The photoresists of the invention possess image distortion temperatures in excess of 200° C. and frequently in excess of 250° C.

The preferred sensitizers used to form the light sensitive photoresist compositions of this invention are formed by condensing an o-quinone diazide sulfonyl chloride or carbonyl chloride with a compound having a functionality reactive with the sulfonyl or carbonyl chloride to form an ester or amide linkage. Using the o-quinone diazide sulfonyl chlorides for purposes of illustration, these compounds typically conform to any one of the following formulas:

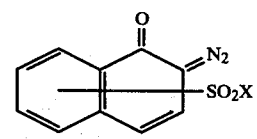

I

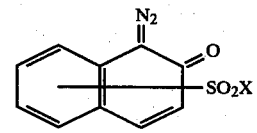

II

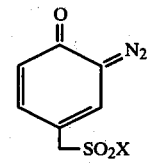

III where X is a halogen, preferably chlorine.

Of the above, the compounds conforming to Formula I are preferred. Compounds conforming to Formula II are less light sensitive than those conforming to Formula I and those conforming to Formula III are infrequently used. With respect to the o-naphthoquinone diazide sulfonyl chlorides, the sulfonyl chloride group is usually in the 4 or 5 position.

The compound condensed with the sulfonyl chloride or carbonyl chloride is preferably an aromatic compound with one or more hydroxyl or amine groups whereby an ester or amide is formed. The reaction of the preferred sensitizer (that of Formula I above) with a diol and a diamine is represented by the following equations:

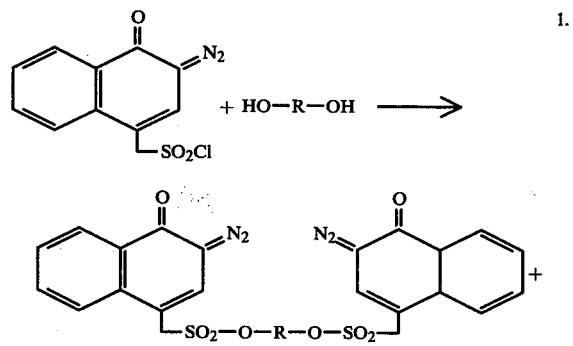

1.

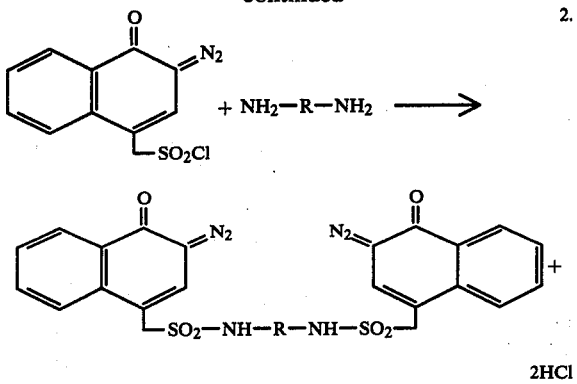

2HCl where R is an organic radical, frequently referred to in the prior art as a "ballast group", which terminology is adopted for use in this specification. The ballast group may be substituted with more than two hydroxyl or amine groups, whereby triesters, tetraesters, triamides and tetramides may be formed rather than diesters or diamides. Reactions of the above type are well known and documented in the literature.

The ballast group may be polymeric with preferably multifunctional repeating units. In this embodiment, the sulfonyl or carbonyl chloride would be condensed onto the repeating units comprising the polymer.

For purposes of this invention, the sensitizer is a high temperature sensitizer having a secondary decomposition temperature of at least 150° C. and preferably in excess of 200° C.

To obtain a high temperature sensitizer, the ballast group is preferably aromatic. More preferably, the ballast group is multifunctional and several moles of the sulfonyl or carbonyl chloride are condensed with the multifunctional ballast group whereby multiesters or multiamides are formed. The multiesters and multiamides formed by condensation of the sulfonyl chloride or carbonyl chloride with the multifunctional ballast group generally yield the preferred high temperature sensitizers used for the formulation of photoresist in accordance with this invention.

The high temperature sensitizer used to formulate the photoresist can be a single sensitizer or a mixture of sensitizers. If a mixture, a sensitizer can be included in the mixture which alone is not a high temperature sensitizer provided the photoresist formulated using the mixed sensitizer possesses an image distortion temperature in excess of 200° C. Suitable sensitizers are known in the patent literature, for example, the high melt sensitizers of U.S. Pat. Nos. 3,046,110; 3,046,118; 3,105,465; 3,130,048; 3,188,210; 3,637,384; and 3,950,173, all incorporated herein by reference.

The polyvinyl phenols used in combination with the sensitizer are those polymers described in the above cited U.S. Pat. No. 3,869,292, having a flow temperature in excess of that temperature where reaction between the sensitizer and polyvinyl phenol occurs. Based upon empirical data, the flow temperature is preferably 150° C. or greater. The polyvinyl phenols may be homopolymers or copolymers of o-, m- and p-vinyl phenols. The vinyl phenols used to form polymers may be non-substituted or may carry any of various substituents that do not adversely affect the ability to develop exposed resist images. For example, such substituents may be alkoxy such as methoxy or ethoxy groups, alkyl groups such as methyl or propyl groups though alkyl substitution may excessively lower the flow temperature of the resultant polymer, carboxyl groups, hydroxyl groups, or halogen such as chlorine or bromine. The homopolymers of ortho and para vinyl phenols are particularly advantageous, but the polyvinyl phenols may all be used in the form of other homopolymers or copolymers with one another, or of copolymers with other vinyl acrylic compounds such as styrene, acrylic acid, acrylic acid ester, methacrylic acid and methacrylic acid esters.

The weight average molecular weight of the polymer should be sufficient to provide a polymer with a flow temperature in excess of the temperature required for reaction between the sensitizer and the polyvinyl phenol, preferably in excess of 150° C. Those polymers having a weight average molecular weight of between 3,500 and 60,000 may be useful but polymers having a weight average molecular weight between 4,000 and 15,000 are preferred provided their flow temperature is as described above.

The polyvinyl phenol may be prepared by block polymerization, emulsion polymerization or solution polymerization of the corresponding momomers in the presence of a cationic catalyst such as boron trifluoride etherate. Such procedures are well known in the art.

Vinyl phenols useful for the production of polymers may be prepared, for example, by hydrolysis of commercially available coumarin or substituted coumarins, followed by decarboxylation of the resulting hydroxy cinnamic acids. Useful vinyl phenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Various processes suitable for production of vinyl phenol are described in detail, for example, in the *Journal of Organic Chemistry*, Volume 3, 1958, pp 544–549.

In formulating a light sensitive composition on a weight basis, the polymeric binder is typically used in major amount and the sensitizer in minor amount, though this is not an absolute requirement. On a solids basis, the sensitizer is preferably present in a concentration of from 10 to 50 weight percent of the total composition and more preferably, in an amount that is from 15 to 30 percent of the composition. The light sensitive compound should be used in sufficient quantity whereby there is adequate reaction with the polyvinyl phenol to yield a resist image distortion temperature exceeding 200° C.

When formulating a photoresist in accordance with the invention, caution must be exercised in the selection of the resist components having requisite temperature properties. For example, there is no precise method for determining the flow temperature of a polyvinyl phenol. Polyvinyl phenols with a relatively large weight average molecular weight, i.e., in excess of 6,000, will, in all probability, possess the necessary flow properties. Alternatively, polyvinyl phenols with a relatively low weight average molecular weight, i.e., less than 3,000, will probably not possess the requisite flow properties. Between these two extremes, it is difficult to predict whether a sample of a polyvinyl phenol will possess the necessary flow properties. Therefore, the best method for determining the suitability of a polyvinyl phenol for the purposes of this invention, is an empirical test where a formulation comprising a known high temperature sensitizer, and the polyvinyl phenol in question is tested using the 1.5 micron window test described above. In applying this test, particularly with a borderline or marginal material, test procedures consistent with precision photolithography as used in the microelectronics industry must be used to obtain valid results. For example, it has been observed in one test of this nature that changing the mask used to form the window caused a change in the results obtained.

The photoresist binder comprises the polyvinyl phenol together with other optional additives such as dyes, softeners, adhesion agents, solubility modifiers and other resins for specific purposes. These optional additives may be used to improve the chemical resistance of the photoresist film, improve its flexibility, improve its scratch resistance, improve its electrical properties, improve its coating characteristics, increase its exposure speed, improve adhesion between it and its substrate, improve its development and resolution characteristics, retard flammability, provide cost savings, provide for a higher solids content to obtain thicker coatings or in the alternative, provide for a lower solids content to obtain thinner coatings, and if used as a dry transfer film, improve its transfer characteristics.

Additives to the polyvinyl phenol binder can be tolerated in amounts that do not make the exposed photoresist film unduly difficult to develop and do not reduce the photoresist image distortion temperature below 200° C. This means that regardless of its concentration, the polyvinyl phenol, as a primary reactant with the high temperature sensitizer, must be present in sufficient quantity to provide a photoresist having an image distortion temperature of 200° C. or greater. This does not mean that it must be present in major amount of the binder. As a general guideline, the greater the flow temperature of the additional resin, the greater is its tolerable concentration without lowering the photoresist image distortion temperature below the above stated minimum. For example, a Novolak resin can be admixed with the polyvinyl phenol resin. The Novolak resins are generally available with varying flow temperatures ranging between about 95° C. and 130° C. Since most Novolak resins are alkali soluble and do not interfere with the development of the exposed photoresist, Novolaks may be tolerated in amounts up to about 50 to 60 percent by weight admixed with the polyvinyl phenol. See example 46 in this respect. Even those Novolaks which have a relatively low flow temperature can be tolerated in significant amounts. See Example 50 where the binder contained 28 percent of a Novolak with a flow temperature of about 105° C.

Naphthol formaldehyde resins are new alkali soluble polymers believed to be first described in Assignee's Copending U.S. patent application Ser. No. 374,054 filed May 3, 1982, now U.S. Pat. No. 4,404,359 incorporated herein by reference. These resins are thermoplastic copolymers formed by the condensation of formaldehyde with an aromatic alcohol such as 2-naphthol or a mixture of a naphthol and a phenol. The naphthol formaldehyde resins have flow at temperatures of from about 100° C. up to and exceeding 160° C. As with the Novolak resins, the naphthol formaldehyde resins can be used in relatively high concentration.

A portion of the polyvinyl phenol binder can comprise a polyvinyl phenol having a flow temperature below the temperature of reaction between the sensitizer and the polyvinyl phenol provided the image distortion temperature of the photoresist is at least 200° C. Similar to the other resins discussed above, those polyvinyl phenols can be used in relatively large concentration.

Additional desirable additives that may be incorporated in the photoresist binder include acrylic resins; polyesters; the polyvinyl alkyl ether resins, such as the polyvinyl methyl ethers; polystyrenes; melamines and benzoquanidines. Where these materials possess a relatively low flow temperature, caution must be exercised in their use as they can also lower the image distortion temperature of the final photoresist film to less than 200° C. when used in excessive quantity. The limitation on the concentration of any of the additive resins is not to lower the image distortion temperature below 200° C. and not to prohibit development of the imaged resist.

The photoresists of this invention are used to form light sensitive coatings in a conventional manner. They may be applied as a liquid coating solution where the photoresist is spin coated, curtain coated, roller coated, whirl coated, doctored, dipped, sprayed, etc.

Suitable solvents for formation of a liquid photoresist include alcohols, ketones, ethers, amides such as dimethyl formamide, esters such as Cellosolve esters and glycol esters, glycol ethers, and other solvents and mixtures as is known in the art. Alternatively, the photoresist may be applied as a preformed dry film using heat and pressure in accordance with known prior art procedures.

If the photoresist composition is applied over a substrate as a liquid coating composition, after application of the photoresist, it is preferably soft baked at a temperature of about 100° C. to remove entrapped solvents. Thereafter, the photoresist coating is exposed in a desired image pattern and developed with an aqueous alkaline solution. If, in the processing sequence, elevated temperatures are encountered, the resist will withstand the elevated temperatures without undergoing image distortion. When raising the temperature of the resist film to a temperature below that where the sensitizer reacts with the polyvinyl phenol, image distortion will not occur because the materials used to formulate the resist were selected to withstand temperatures of up to about 150° C. to 160° C. If the processing sequence raises the temperature of the resist to above the reaction temperature of the resist components, image distortion will not occur because the reaction will significantly increase the photoresist image distortion temperature. Therefore, though a high temperature post bake can be employed if desired to increase the image distortion temperature of the resist, it is not necessary because the reaction to increase distortion temperature can occur as a consequence of the processing sequence.

The resists of this invention can be used for many applications for which photoresists are conventionally used in the prior art, including the graphic arts. Because of the high temperature properties, the photoresists of the invention may also be used for high temperature processes for which prior art resists could not be used. By selecting the appropriate sensitizer, the photoresists can be imaged by deep u.v. electron beam, laser or any other activating energy conventionally used for imaging photoresists.

The increased image distortion temperature of the photoresist as a consequence of heating is unexpected. For example, the temperature at which the image distorts using a photoresist comprising a high temperature sensitizer and those Novolak resins conventionally used in the preparation of photoresist formulations is not significantly increased by a post bake and in fact, if such a photoresist were imaged and heated to a temperature of 150° C. or greater, substantial image distortion would occur.

Though not wishing to be bound by theory, it is believed that heating the photoresist to an elevated temperature causes a chemical reaction to occur between unexposed sensitizer and the polyvinyl phenol of the binder, thereby resulting in the significant increase in the image distortion temperature of the photoresist. This theory is supported by the observation that if a developed photoresist film is blanket exposed to decompose sensitizer prior to heating, the heating step will not produce the increase in the image distortion temperature. This is particularly surprising since both u.v. exposure and first stage thermal decomposition cause nitrogen loss, but only the thermally decomposed sensitizer appears to be reactive with the polyvinyl phenol.

The inability of the u.v. exposed sensitizer to react with the polyvinyl phenol to increase the image distortion temperature of the resist is a further distinction of the resists of this invention from those formulated with Novolak resins of the prior art. The literature (Journal of the Electrochemical Society, Vol. 128, No. 12, Dec., 1981, pp 2645-2647) suggests that a u.v. exposure of a prior art Novolak based resist increases its resistance to flow at elevated temperatures, a result totally opposite from the results obtained with the results of the subject invention.

Photoresist formulations, in accordance with this invention, may be formulated as dry transfer films or as liquid coating compositions, both in accordance with prior art procedures. As a dry film, the photoresist is typically cast onto a carrier sheet and transferred to a substrate. As a liquid coating composition, the photoresist components are dissolved in a solvent or mixture of solvents so that the photoresist has a solids content of from about 10 to 60 weight percent, dependent upon the desired rheology of the coating composition. The photoresist comprises the sensitizer and the binder with the sensitizer comprising from about 10 to 50 percent, and preferably, 15 to 30 percent, by weight, of the total solids. The sensitizer must be present in a concentration sufficient to provide satisfactory image resolution and to provide suitable reaction with the polyvinyl phenol to obtain an image distortion temperature in excess of 200° C.

The photoresists of this invention are suitable for many industrial uses. For example, in the manufacture of semiconductor devices, miniaturization is becoming increasingly important. Generally, the semiconductor industry now produces etched images of three microns or less, but the industrial goal is for one micron or submicron images. To produce images lower than three microns, it is important that the photoresist have high temperature thermal stability to permit the practical use of ion implantation, plasma etching, reactive ion etching, metal sputtering and other newly developed manufacturing procedures. The photoresists of this invention not only possess the high temperature capability required for such new techniques, but also are characterized by an ability of an image photoresist film to withstand plasma etching without incurring excessive thickness loss, line width loss or edge acuity degradation. In addition, the photoresists of this invention are capable of reproducing submicron images.

The photoresists of this invention have the ability to withstand temperatures of at least 200° C. without significant image distortion. One and a half micron wide windows and spacings will remain open during heating to temperatures in excess of 200° C. while imaged bars and lines will retain their shape and edge acuity at the interface of the photoresist with the substrate. The preferred photoresists of this invention have the capability of withstanding temperatures of up to 250° C. without image distortion. Temperatures in excess of 250° C. might vaporize the resist before image distortion occurs.

In the manufacture of printed wiring boards, circuit densification is becoming increasingly important. An industry goal is a capability for producing two mil wide circuit lines with thicknesses greater than one mil. To accomplish this, it is necessary that a photoresist provide excellent resolution; possess a high temperature capability so as to be able to withstand a soldering operation; possess good dielectric properties; possess resistance to strong alkaline plating baths for many hours; be capable of providing coatings with thicknesses greater than one mil with vertical side walls to contain plated copper; and possess resistance to solder fluxes during a soldering operation. The photoresists of this invention are capable of meeting these stringent requirements. A heating step to a temperature in excess of 125° C. provides a required resistance to strong alkali without adversely affecting the resolution of an imaged photoresist. For this use, the photoresist is applied as a permanent mask and becomes a part of the finished printed wiring board.

Another application for the photoresists of this invention is as a photoimageable solder mask where the photoresist is applied over a finished printed wiring board. The solder mask protects the metal conductors of the printed wiring board from the soldering operation, except for those areas where soldering connections to the metal conductors are desired.

In the semiconductor and hybrid circuit industries, passivation coatings are used in selective areas for serving as a hermetic seal. Requirements for this use are high temperature capability with image stability and good dielectric properties. The photoresists of this invention are suitable for such application.

The photoresists of this invention are also useful for photoengraving operations. For example, the photoresists may be coated over a metal, imaged, and used as an etch resist to etch the underlying metal. A typical photoengraving process would be the manufacture of bimetallic printing plates.

The following examples will serve to better illustrate the invention. Many of the examples give results in terms of distortion temperature of a test resist. The 1.5 micron window test described above was used to determine distortion temperature.

EXAMPLE 1

Positive working, high temperature diazo sensitizers were prepared according to the general procedures of the prior art. The following table sets forth the identity of the sensitizers prepared and the identity of the prior art relied upon to prepare the sensitizer:

| Sensitizer | Prior Art |
|---|---|
| A. Diester mixture formed by condensing naphthoquinone-(1,2)-diazide-(5)-sulfonic acid chloride with 2,2', | U.S. Pat. No. 3,106,465, column 1, lines 49 to 66 |

-continued

| Sensitizer | Prior Art |
|---|---|
| 4,4'-tetrahydroxybenzophenone | |
| B. Mixture of diesters and triesters formed by condensing naphthoquinone-(1,2)-diazide-(5)-sulfonic acid chloride with 2,3,4-trihydroxybenzophenone | Same as A |
| C. Mixture of monesters, diesters and triesters formed by condensing naphthoquinone-(1,2)-diazide-(5)-sulfonic acid chloride with 2,3, 4-trihydroxybenzophenone | Same as A |
| D. Diester formed by condensing naphthoquinone-(1,2)-diazide-(5)-sulfonic acid chloride with 2,4-dihydroxybenzophenone | U.S. Pat. No. 3,046,118, column 14, lines 19 to 37 |
| E. Monosulfonamide formed by condensing haphthoquinone-(1,2)-diazide-(5)-sulfonic acid chloride with dehydroabietylamine | U.S. Pat. No. 3,637,384, column 3, lines 30 to 38 |

The above sensitizers were subjected to thermal gravimetric analysis using a Perkin Elmer Thermogravimetric system 2 in a mixture of oxygen and nitrogen as the purge gas. Temperature was increased at a rate of 10° C. per minute. The results are set forth in the drawing for the above sensitizers where the top curve is for sensitizer D and the bottom curve for sensitizer B. The other sensitizers gave curves within the shaded area between the curves. For all sensitizers a first decomposition occurs between a temperature of about 120° C. and 160° C. and thereafter, a second decomposition occurs at a temperature of about 220° C. and continues until essentially all sensitizer is destroyed.

EXAMPLES 2 THROUGH 14

Photoresist solutions were prepared by dissolving diazo sensitizers and polyvinyl phenols in various solvents. The materials used and their concentrations are set forth in the following table:

| Example No. | Resin[1] | Percent Resin[2] | Sensitizer[3] | Percent Sensitizer[2] | Solvent[4] | Percent Solids[5] |
|---|---|---|---|---|---|---|
| 2 | AA | 78 | A | 22 | MCA | 27 |
| 3 | AA | 78 | B | 22 | CA | 27 |
| 4 | AA | 78 | C | 22 | CA | 27 |
| 5 | AA | 78 | D | 22 | Diglyme | 30 |
| 6 | AA | 78 | E | 30 | DMF/Diglyme | 28 |
| 7 | BB | 80 | A | 20 | MCA | 30 |
| 8 | BB | 78 | B | 22 | MCA | 30 |
| 9 | BB | 80 | C | 20 | MCA | 30 |
| 10 | BB | 78 | D | 22 | Diglyme | 33 |
| 11 | CC | 78 | A | 20 | MCA | 30 |
| 12 | CC | 78 | B | 22 | MCA | 30 |
| 13 | CC | 78 | C | 20 | MCA | 30 |
| 14 | CC | 78 | D | 22 | MCA | 33 |

[1] AA represents a p-polyvinyl phenol with a weight average molecular weight of about 8000; BB represents a polyvinyl phenol with a weight average molecular weight of about 5000, and CC represents a polyvinyl phenol with a weight average molecular weight of about 3000.
[2] Percentages of total solids.
[3] Letters refer to sensitizers of Example 1.
[4] MCA — methyl Cellosolve acetate.
CA — Cellosolve acetate.
Diglyme — diethylene glycol dimethyl ether.
DMF — dimethyl formamide.
[5] Weight percent of total solids in solution.

Each formulation set forth in the above table was used to coat a chrome mask blank using a spin-coater (Headway model No. EC-101) at a spin speed sufficient to form a coating having a thickness of between about 1.4 to 1.8 microns. For most parts, a speed of 3500 RPM was used. After spin-coating, all parts were dried for forty-five minutes at a temperature of about 100° C. in a convection type oven with fresh air circulation. The coated parts were then contact exposed through an Opto-Line glass multidensity resolution target having both bars and windows ranging from one to fifty microns in width. The exposure unit was an Oriel Model 8410 Photomask Printer. An exposure time of approximately twenty seconds was used. The parts were then immersion developed in an aqueous alkaline solution (AZ Developer of American Hoechst Corporation) with agitation by gentle swirling and at two strengths designed to provide clean development. The length of immersion time varied from sixty seconds up to one hundred twenty seconds to develop the forty percent light transmittance step though a few parts were developed for less time sufficient to develop the twenty percent light transmittance step. The parts were then thoroughly rinsed with clean running water and forced air dried. After standing for at least several hours at ambient temperature, for testing purposes, the parts were placed directly into a fresh air circulating convection oven preheated to 200° C. The parts were removed after thirty minutes in the oven and evaluated with a microscope at 900X magnification. A second set of parts was processed in the same manner, but post baked at 250° C. A third set of parts, except for parts corresponding to Examples 11 to 14, was processed in the same way but blanket exposed for three minutes prior to baking. All parts were evaluated using the procedure for determining image distortion temperature set forth above. The results are set forth in the following table:

| Example No. | 250° C. Test | 200° C. Test | 200° C. Test Blanket Exposed | Developer Strength (Percent) |
|---|---|---|---|---|
| 2 | passes | passes | distorts | 20 |
| 3 | passes | passes | distorts | 20 |
| 4 | passes | passes | distorts | 20 |
| 5 | passes | passes | distorts | 20 |
| 6 | passes* | passes | passes* | 45 |
| 7 | distorts | distorts | distorts | 12 |
| 8 | distorts | distorts | distorts | 12 |
| 9 | distorts | distorts | distorts | 12 |
| 10 | distorts | distorts | distorts | 14 |
| 11 | distorts | distorts | — | 12 |
| 12 | distorts | distorts | — | 12 |
| 13 | distorts | distorts | — | 12 |
| 14 | distorts | distorts | — | 14 |

*marginal - detectable flow, but image integrity at interface

The results show that the combination of a high temperature sensitizer with a polyvinyl phenol possessing suitable flow properties provides a photoresist that does not distort at temperatures as high as 250° C. Conversely, use of a high temperature sensitizer with a polyvinyl phenol with inadequate flow properties provides a photoresist that distorts at a temperature below 200° C.

Examples 2 through 5 constitute a preferred embodiment of the invention.

The results further show that blanket exposure of the photoresist prior to heating to a temperature in excess of the reaction temperature inhibits the reaction from occurring.

The procedure of Examples 6 through 14 was repeated, but an Opti-Line quartz multidensity resolution target was substituted for the glass target used in the prior examples. Those parts having the formulation of Examples 6 through 10 passed the test though the results in all cases were inferior to the results obtained using the photoresist of Examples 1 through 5. Those parts having the formulation of Examples 11 through 14 distorted and failed the test. It is difficult to explain the differing results obtained with Examples 6 through 10 and Examples 6 through 10 repeated substituting the quartz for the glass target. However, it is believed that the glass target used in the earlier examples was inadequately cleaned resulting in light scattering at the edges of the image. It is believed that this light scattering was equivalent to exposure resulting in a poorer image resolution and appearance of distortion under magnification. The differing results point out that the polyvinyl phenol having the weight average molecular weight of 5000 is a marginal material for purposes of the invention and consequently, a lesser preferred material as greater care is required in its use. It should be further pointed out that resin AA having a weight average molecular weight of about 8000 is clearly a useful material while that specific resin designated CC having a weight average molecular weight of 3000 is clearly an unacceptable material.

EXAMPLES 15 AND 16

A positive working low temperature monester diazo sensitizer was prepared by condensing naphthoquinone-(1,2)-diazide-(4)-sulfonic acid chloride with p-cumyl phenol in accordance with the procedures of U.S. Pat. No. 3,640,992. This sensitizer was designated sensitizer F. Photoresist solutions were prepared from the polyvinyl phenol designated resin AA and blends of the high temperature sensitizer designated sensitizer C and the low temperature sensitizer designated sensitizer F. The photoresist utilized methyl Cellosolve acetate as the solvent and on a percent solids bases, comprises 78 percent resin and 22 percent resist with a total solids content of 27 percent. Following the procedures of Examples 2 through 14, chrome masks were coated with photoresist and subjected to the window test at temperatures of 250° C. and 200° C. and in a third test, blanket exposed and subjected to the window test at a temperature of 200° C. The results are set forth in the following table:

| Example No. | Sensitizer | Percent Sensitizer | 250° C. | 200° C. | Blanket Exposed 200° C. |
|---|---|---|---|---|---|
| 15 | C | 11 | passes* | passes | distorts |
|    | F | 11 |  |  |  |
| 16 | C | 16½ | passes | passes | distorts |
|    | F | 5½ |  |  |  |

*marginal — detectable flow, but image integrity at interface

The above results indicate that low temperature sensitizers can be successfully blended with high temperature sensitizers when combined with a suitable polyvinyl phenol resin though it is preferred that low temperature sensitizers not be included in the formulation.

EXAMPLES 17 THROUGH 24

Photoresist solutions were prepared by admixing the polyvinyl phenol designated AA and the polyvinyl phenol designated BB in varying proportions together with that sensitizer identified as sensitizer C. Of the solids, the polyvinyl phenol comprised 78 percent by weight of the photoresist solids and the sensitizer 22 percent by weight. The various photoresists prepared were subjected to the test procedure of Examples 2 through 14 and given the window test at a temperature of 250° C. and 200° C. with and without a post image blanket exposure. The glass target used in Examples 2 through 14 was also used for these Examples. The proportion of each resin and the results of the window test are set forth in the following table:

| Example No. | Percent Resin AA | Percent Resin BB | 250° C. | 200° C. | Blanket Expose 200° C. |
|---|---|---|---|---|---|
| 17 | 100 | 0 | passes | passes | distorts |
| 18 | 67 | 33 | passes | passes | distorts |
| 19 | 40 | 60 | passes* | passes | distorts |
| 20 | 30 | 70 | passes* | passes | distorts |
| 21 | 20 | 80 | distorts | passes | distorts |
| 22 | 15 | 85 | distorts | passes* | distorts |
| 23 | 10 | 90 | distorts | passes* | distorts |
| 24 | 0 | 100 | distorts | distorts | distorts |

*marginal — detectable flow, but image integrity at interface

The results establish that the polyvinyl phenol that failed the window test by itself in Examples 2 through 14 can be admixed with that polyvinyl phenol which passed the window test with the expected reduction in quality but with the resist passing the window test.

EXAMPLES 25 THROUGH 44

Photoresist solutions were prepared by admixing polyvinyl phenol with various sensitizers in various quantities. Formulations for these photoresists are set forth in the following table:

| Example No. | Resin[1] | Percent Resin[2] | Sensitizer[3] | Percent Sensitizer[2] | Percent Solids[4] |
|---|---|---|---|---|---|
| 25 | AA | 50 | E | 50 | 30 |
| 26 | AA | 60 | E | 40 | 29 |
| 27 | AA | 70 | E | 30 | 28 |
| 28 | AA | 80 | E | 20 | 27 |
| 29 | AA - BB | 75 | B | 25 | 27 |
| 30 | AA - BB | 80 | B | 20 | 27 |
| 31 | AA - BB | 85 | B | 15 | 27 |
| 32 | AA - BB | 90 | B | 10 | 27 |
| 33 | AA - BB | 75 | C | 25 | 27 |
| 34 | AA - BB | 80 | C | 20 | 27 |
| 35 | AA - BB | 85 | C | 15 | 27 |
| 36 | AA - BB | 90 | C | 10 | 27 |
| 37 | AA - BB | 75 | A | 25 | 27 |
| 38 | AA - BB | 80 | A | 20 | 27 |
| 39 | AA - BB | 85 | A | 15 | 27 |
| 40 | AA - BB | 90 | A | 10 | 27 |
| 41 | AA - BB | 75 | D | 25 | 27 |
| 42 | AA - BB | 80 | D | 20 | 27 |
| 43 | AA - BB | 85 | D | 15 | 27 |
| 44 | AA - BB | 90 | D | 10 | 27 |

[1]The designations AA and BB represent polyvinyl phenols as set forth in Examples 2 through 14. AA - BB represents a mixture of two parts resin AA and one part resin BB.
[2]Percentage of total solids.
[3]Letters refer to sensitizers of Example 1.
[4]Weight percent of total solids in solution. For Examples 25 through 28, the solvent was a mixture of dimethyl formamide and diglyme. For Examples 29 through 44, the solvent was methyl Cellosolve acetate.

Following the procedure of Example 2 and using chrome masks, the photoresists were coated onto the masks, dried, exposed, developed, post baked at 250° C. and examined. The results are set forth in the following table:

| Example No. | 250° C. | 200° C. | Blanket Expose 200° C. | AZ Developer[1] Percent |
|---|---|---|---|---|
| 25 | passes* | passes | distorts | 75 |
| 26 | passes | passes | passes* | 60 |
| 27 | passes* | passes | passes* | 45 |
| 28 | passes* | passes | passes* | 30 |
| 29 | passes | passes | distorts | 20 |
| 30 | passes | passes | distorts | 20 |
| 31 | passes | passes | distorts | 20 |
| 32 | passes | passes | distorts | 18 |
| 33 | passes | passes | distorts | 20 |
| 34 | passes | passes | distorts | 18 |
| 35 | passes | passes | distorts | 18 |
| 36 | distorts | passes | distorts | 18 |
| 37 | passes | passes | distorts | 22 |
| 38 | passes | passes | distorts | 20 |
| 39 | passes | passes | passes* | 18 |
| 40 | passes | passes | passes* | 16 |
| 41 | passes | passes | distorts | 22 |
| 42 | passes | passes | distorts | 22 |
| 43 | passes | passes | distorts | 22 |
| 44 | distorts | passes | distorts | 22 |

*marginal — detectable flow, but image integrity at interface
[1]In all cases, the developer was an aqueous alkaline solution known as AZ Developer. Different strengths were used based upon the photoresist formulation and the needed strength to get good resolution.

The results show that the concentration of the sensitizer is important, not only for resolution, but also for thermal stability. Sensitizer E produced photoresists which were not so badly affected by blanket exposure prior to the 200° C. test. Sensitizer A in smaller amounts similarly showed less adverse effect, but in all cases, blanket exposure resulted in significant loss of resolution.

EXAMPLES 45 THROUGH 54

Photoresist solutions were made with that polyvinyl phenol designated AA mixed with other resins and that sensitizer identified Sensitizer D in Example 1. The photoresist utilized diglyme as the solvent and the sensitizer was present in a concentration of twenty-two percent of total solids. The resins used and their concentrations are set forth as follows:

| Example No. | Resin[1] | Concentration Percent | AZ Developer Percent |
|---|---|---|---|
| 45 | Novolak-1 | 100 | 25 |
| 46 | AA | 50 | 22½ |
|  | Novolak-1 | 50 |  |
| 47 | AA | 67 | 22½ |
|  | Novolak-1 | 33 |  |
| 48 | AA | 80 | 22½ |
|  | Novolak-1 | 20 |  |
| 49 | Novolak-2 | 100 | 25 |
| 50 | AA | 72 | 25 |
|  | Novolak-2 | 28 |  |
| 51 | AA | 86 | 25 |
|  | Novolak-2 | 14 |  |
| 52 | AA | 90 | 30 |
|  | PVME | 10 |  |
| 53 | AA | 95 | 20 |
|  | NME | 5 |  |
| 54 | AA | 100 | 20 |

[1]Novolak-1 is a phenol-formaldehyde resin with a melting point of about 150° C. and a flow point of about 135° C.; Novolak-2 is a similar resin with a melting point of about 110° C. and a flow point of about 105° C.; PVME is a polyvinyl methyl ether which has a K value of approximately 45 and is tacky in its dried state at ambient temperature suggesting a flow point lower than ambient temperature.

Following the procedure of Examples 2 through 14, three sets of each of the above formulations were dried, exposed, developed and post baked. The first set of so coated samples was post baked at 250° C., the second at 200° C. and the third at 200° C. preceded by a blanket exposure. The results are set forth in the following table:

| Example No. | 250° C. | 200° C. | Blanket Expose 200° C. |
|---|---|---|---|
| 45 | distorts | distorts | distorts |
| 46 | distorts | passes* | distorts |
| 47 | passes* | passes | distorts |
| 48 | passes | passes | distorts |
| 49 | distorts | distorts | distorts |
| 50 | distorts | passes* | distorts |
| 51 | passes | passes | distorts |
| 52 | passes | passes | distorts |
| 53 | passes | passes | distorts |
| 54 | passes | passes | distorts |

*marginal - detectable flow, but image integrity at interface

The results indicate that low flow point resins can be incorporated into the resists of this invention. The results also show that conventional Novolak resins can be used, but larger amounts degrade thermal stability properties. Example 48 constitutes a preferred embodiment of this invention.

In the claims that follow, certain terms are used which are defined above. Where these terms appear in the claims, they are to be interpreted as defined.

We claim:

1. A process for increasing the photoresist distortion temperature of a photoresist film comprising a high temperature, positive working diazo sensitizer and a resin system of a thermoplastic polyvinyl phenol to in excess of the flow temperature of the polyvinyl phenol and in excess of 200° C., said sensitizer having a secondary decomposition temperature and said polyvinyl phenol having a flow temperature in excess of 200° C. and in excess of the temperature at which reaction occurs between the two, said process comprising the steps of exposing said film to activating radiation in an image pattern, developing said film and heating said film to a temperature in excess of 200° C. and for a time at least sufficient to cause reaction to occur between said sensitizer and said polyvinyl phenol, said heating step occurring during or subsequent to imaging.

2. The process of claim 1 where the sensitizer is selected from the group of esters and amides of an o-quinone diazide sulfonic or carboxylic acid chloride.

3. The process of claim 2 where the sensitizer is an ester of an o-naphthoquinone diazide sulfonic acid chloride.

4. The process of claim 2 where the sensitizer is a multiester.

5. The process of claim 2 where the sensitizer is a mixture of a monoester and one or more multiesters.

6. The process of claim 2 where the image distortion temperature is increased to at least about 250° C.

7. The process of claim 2 where the heating step is a post image bake.

8. The process of claim 2 where the heating step is incident to the step of forming an image in a substrate underlying the photoresist film.

9. The process of claim 8 where the image in the underlying substrate is formed by plasma etching.

10. The process of claim 8 where the image in the underlying substrate is formed by reactive ion etching.

11. The process of claim 2 where the resin system comprises the polyvinyl phenol and one or more additional resins.

12. The process of claim 11 where the additional resin is a polyvinyl phenol having a flow temperature below the temperature at which reaction occurs between the sensitizer and the polyvinyl phenol.

13. The process of claim 11 where the other resin is an alkali insoluble resin.

14. The process of claim 11 where the other resin in a Novolak resin.

15. The process of claim 11 where the other resin is a polyvinyl alkyl ester.

16. The process of claim 11 where the other resin is a condensation product of a naphthol and formaldehyde.

17. The process of claim 11 where the other resin is a melamine resin.

* * * * *